United States Patent
Lin et al.

(10) Patent No.: US 9,408,313 B2
(45) Date of Patent: Aug. 2, 2016

(54) PACKAGING SUBSTRATE AND METHOD OF FABRICATING THE SAME

(71) Applicant: Unimicron Technology Corp., Taoyuan (TW)

(72) Inventors: Chun-Ting Lin, Hsinchu County (TW); Ying-Chih Chan, Taoyuan County (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 14/174,858

(22) Filed: Feb. 7, 2014

(65) Prior Publication Data

US 2014/0182913 A1 Jul. 3, 2014

Related U.S. Application Data

(63) Continuation-in-part of application No. 14/018,757, filed on Sep. 5, 2013, now Pat. No. 9,111,818.

(51) Int. Cl.
*H05K 1/11* (2006.01)
*H05K 3/40* (2006.01)
*H05K 3/06* (2006.01)

(52) U.S. Cl.
CPC ........ *H05K 3/4007* (2013.01); *H01L 2224/131* (2013.01); *H01L 2224/13017* (2013.01); *H01L 2224/13082* (2013.01); *H01L 2224/13147* (2013.01); *H01L 2224/81385* (2013.01); *H05K 3/062* (2013.01); *H05K 2201/0367* (2013.01); *H05K 2201/0376* (2013.01); *Y10T 29/49156* (2015.01)

(58) Field of Classification Search
USPC ........................................... 174/261; 361/767
See application file for complete search history.

(56) References Cited

U.S. PATENT DOCUMENTS

| | | | | |
|---|---|---|---|---|
| 8,841,765 B2* | 9/2014 | Haba | ................... | H01L 25/0652 |
| | | | | 257/686 |
| 2008/0253097 A1* | 10/2008 | Kawano | ........................ | 361/766 |
| 2011/0162876 A1* | 7/2011 | Arvin et al. | .................... | 174/257 |
| 2013/0180651 A1* | 7/2013 | Yen et al. | ....................... | 156/247 |

* cited by examiner

*Primary Examiner* — Andargie M Aychillhum
(74) *Attorney, Agent, or Firm* — CKC & Partners Co., Ltd.

(57) ABSTRACT

A packaging substrate is provided, including a substrate body and conductive pillars. The substrate body has a first surface and a second surface opposite to the first surface. The first surface has a plurality of first conductive pads, and the second surface has a die attach area and a peripheral area surrounding the die attach area. The die attach area has a plurality of second conductive pads embedded therein, wherein top surfaces of the second conductive pads are exposed from the second surface, and the die attach area of the second surface is fully exposed. The conductive pillars are correspondingly disposed on the second conductive pads and have first ends and opposite second ends. The first ends are closer than the second ends from the second conductive pads, and the first ends have a width bigger than a width of the second ends. A fabricating method thereof is also provided.

5 Claims, 5 Drawing Sheets

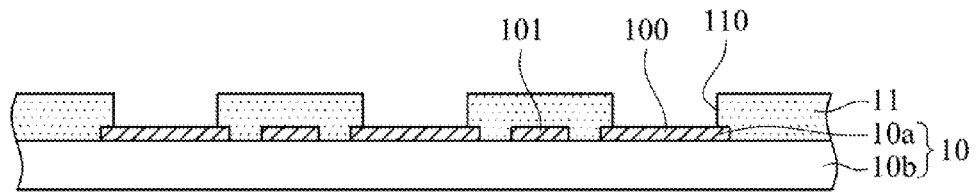
FIG. 1A
(PRIOR ART)
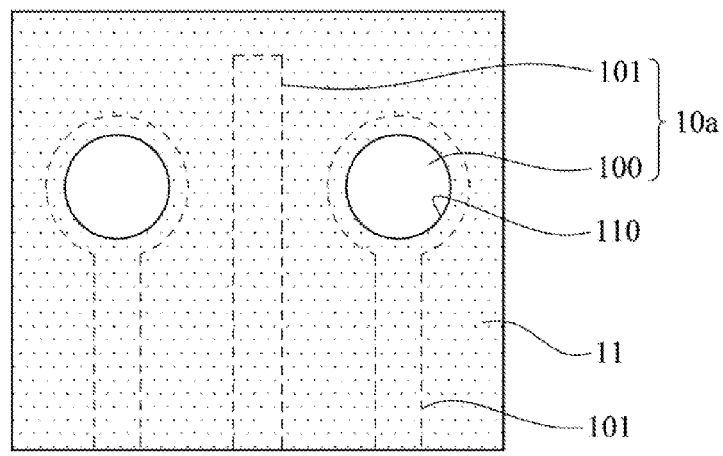
FIG. 1A'
(PRIOR ART)
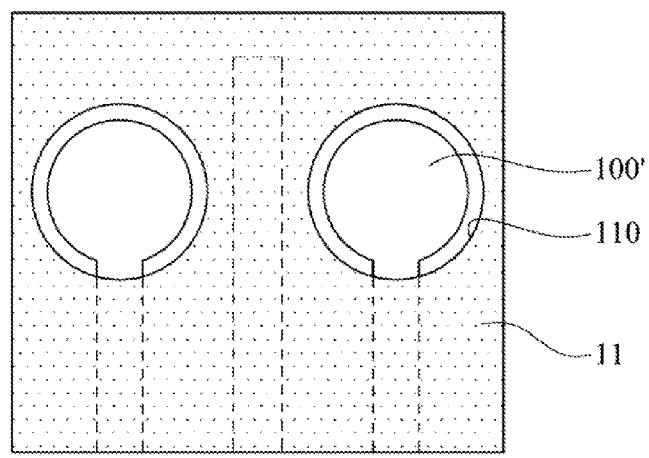
FIG. 1A"
(PRIOR ART)

PACKAGING SUBSTRATE AND METHOD OF FABRICATING THE SAME

This application is a continuation-in-part of U.S. application Ser. No. 14/018,757, filed Sep. 5, 2013, and this application also claims priority to Taiwan Patent Application Serial Number 101225514, filed Dec. 28, 2012. The aforementioned applications are hereby incorporated herein by reference.

BACKGROUND

1. Technical Field

The present disclosure relates to packaging substrates, and, more particularly, to a semiconductor packaging substrate.

2. Description of Related Art

With the development of electronic industry, electronic product designs have trended to be compact-sized and multiple-functioned, and semiconductor package technology has also developed different package types to satisfy various needs in the electronic product designs. In view of the different package types of semiconductor structures, different types of packaging substrate are also developed. A conventional flip-chip packaging substrate has a chip placement region on a surface of the substrate body. A plurality of conductive pads are disposed in the chip placement region, and a solder mask having a plurality of openings for exposing the conductive pads is respectively formed on the substrate body. During a packaging process, a semiconductor chip in the chip placement region is electrically connected to the conductive pads by a flip-chip method.

FIGS. 1A-1E are schematic cross-sectional views at various stages of fabricating a conventional packaging substrate 1.

As shown in FIG. 1A, a substrate body 10 covered by an insulating protective layer 11 is provided, the substrate body 10 has a plurality of conductive pads 100 disposed on a surface thereof, and the insulating protective layer 11 is utilized as a solder mask and has a plurality of openings 110 such that a portion of end surfaces of the conductive pads 100 are exposed by the openings 110, causing the conductive pads 100 to be solder-mask-defined (SMD).

The substrate body 10 includes a dielectric layer 10b and a circuit layer 10a disposed on the dielectric layer 10b (as shown in FIG. 1A'). The circuit layer 10a has a plurality of conductive traces 101 and the conductive pads 100 connected to the conductive traces 101. The end surfaces of the conductive pads 100 are round, and the openings 110 are also round.

As shown in FIG. 1A", 110 of the insulating protective layer 11 can also expose all end surfaces of the conductive pads 100' such that the conductive pads 100' are non-solder-mask-defined.

FIG. 1B shows a subsequent process of FIGS. 1A and 1A'. A resist layer 12 is formed on the insulating protective layer 11, and has a plurality of openings 120 exposing the conductive pads 100 by exposure and development methods. A diameter W of the opening 120 is bigger than a diameter V of the opening 110.

As shown in FIG. 1C, copper bumps 13 are formed by electroplating on the openings 120 such that the conductive pads 100 are electrically connected to the copper bumps 13.

As shown in FIG. 1D, the resist layer 12 is removed.

As shown in FIG. 1E, solder bumps 15 are correspondingly formed on the copper bumps 13 to cover the copper bumps 13.

In the structure of SMD of a conventional packaging substrate 1, since the aligning accuracy e of an exposing machine is, for example, less than or equal to 12.5 μm, as shown in FIG. 1B, the diameter W of an opening 120 of the resist layer 12 is bigger than a diameter V of an opening 110 of the insulating protective layer 11, resulting that the copper bump 13 forms a wing structure 130 (as shown in FIG. 1C). Therefore, a certain spacing P between the solder bumps 15 should be maintained to prevent a bridge connection (as shown in FIG. 1E), and the spacing P between the solder bumps 15 cannot be reduced to, for example, 130 μm or less, in order to satisfy demands for fine-pitch and multi joints.

Moreover, in the conventional SMD, during the performance of Temperature Cycling Test (TCT), because of the great difference between the coefficients of thermal expansion (CTE) of the wing structure 130 and the insulating protective layer 11, the uneven thermal stress may easily cause a crack c at the insulating protective layer 11 under the wing structure 130, as shown in FIG. 1D. The crack c not only reduces the reliability of the packaging substrate 1, but also causes the failure of test for the packaging substrate 1.

Furthermore, because of the formation of the wing structure 130, the diameter v of the opening 110 is less than the greatest diameter of the copper bump 13 (as the diameter w of the wing structure 130) such that the diameter v of the opening 110 may not equal to the greatest diameter of the copper bump 13, as shown in FIG. 1D. Therefore, the reliability of the copper bump 13 cannot be enhanced so that a solder ball may be left off during the push-pull bond test for the solder bump 15.

In addition, in the conventional SMD, as shown in FIG. 1A', the spacing S between the conductive pad 100 and the conductive traces 101 directly effects the yield. If the spacing S is small, the yield of a circuit is low. However, in the conventional packaging substrate 1, the yield cannot be promoted due to the fact that the spacing S cannot be increased any further.

On the other hand, in the conventional NSMD, as shown in FIG. 1A", because the contact area between the circuit layer 10a' and the insulating protective layer 11 is small, compared with the conventional SMD design, the bonding ability between the circuit layer 10a' and the dielectric layer 10b is worse.

Therefore, there is a need for an improved packaging substrate to address the aforementioned problems in the art.

SUMMARY

The present disclosure provides a packaging substrate to solve the problems in the art.

In view of the aforementioned problems met in the art, the present disclosure provides a packaging substrate comprising a substrate body and a plurality of conductive pillars. The substrate body has a first surface and a second surface opposite to the first surface. The first surface has a plurality of first conductive pads, and the second surface has a die attach area and a peripheral area surrounding the die attach area. The die attach area has a plurality of second conductive pads embedded therein, wherein the top surfaces of the second conductive pads are exposed from the second surface, and the die attach area of the second surface is fully exposed.

The conductive pillars are correspondingly disposed on the second conductive pads, and have first ends and opposite second ends. The first ends are closer than the second ends from the second conductive pads, and the first ends have a width bigger than a width of the second ends.

In an embodiment, the packaging substrate further comprises a first insulating protective layer covering the first surface of the substrate body and having a plurality of openings exposing part of the first conductive pads.

In an embodiment, the packaging substrate further comprises a second insulating protective layer covering the peripheral area of the second surface.

In an embodiment, the packaging substrate further comprises a plurality of solder layers correspondingly disposed on the conductive pillars.

The present disclosure also provides a method for fabricating a packaging substrate. The method comprises several operations. A substrate body is provided, which has a first surface and a second surface opposite to the first surface and a whole-sheeted metal layer covering the second surface. The first surface has a plurality of first conductive pads, and the second surface has a die attach area and a peripheral area surrounding the die attach area. The die attach area has a plurality of second conductive pads embedded therein, wherein top surfaces of the second conductive pads are exposed from the second surface. The whole-sheeted metal layer contacts the second conductive pads. A photo-lithography and etching process is performed on the whole-sheeted metal layer to form a plurality of conductive pillars correspondingly disposed on the second conductive pads. The conductive pillars have first ends and opposite second ends. The first ends are closer than the second ends from the second conductive pads, and the first ends have a width bigger than a width of the second ends.

The operations of performing the photo-lithography and etching process are as following: A first photo-resist layer is formed on the first surface of the substrate body and a second photo-resist layer is formed on the whole-sheeted metal layer. The second photo-resist layer has a plurality of openings correspondingly aligned with the second conductive pads. A mask metal layer is formed on the whole-sheeted metal layer in the openings. The first and second photo-resist layers are removed. The whole-sheeted metal layer is etched to form the conductive pillars correspondingly disposed on the second conductive pads.

In an embodiment, the method further comprises removing the mask metal layer to expose the second ends of the conductive pillars.

In an embodiment, the method further comprises forming a first insulating protective layer on the first surface of the substrate body. The insulating first protective layer has a plurality of openings to expose parts of the first conductive pads.

In an embodiment, the method further comprises forming a second insulating protective layer on the peripheral area of the second surface of the substrate body.

BRIEF DESCRIPTION OF THE DRAWINGS

For a more complete understanding of the present invention, and the advantages thereof, reference is now made to the following descriptions taken in conjunction with the accompanying drawings, in which;

FIGS. 1A-1E are schematic cross-sectional views at various stages of fabricating a conventional packaging substrate, wherein FIG. 1A' is a local top view of FIG. 1A, and FIG. 1A" is another pattern of FIG. 1A'.

DETAILED DESCRIPTION

Figure 1B:
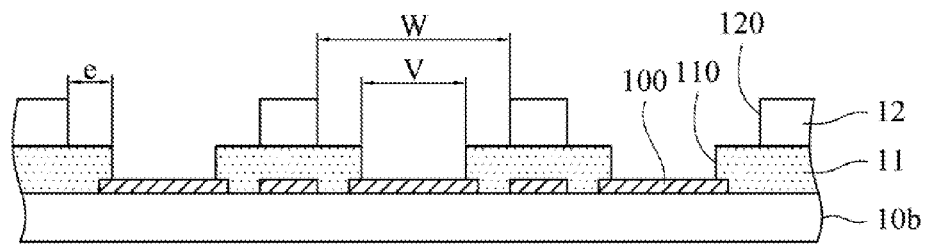
Figure 1C:
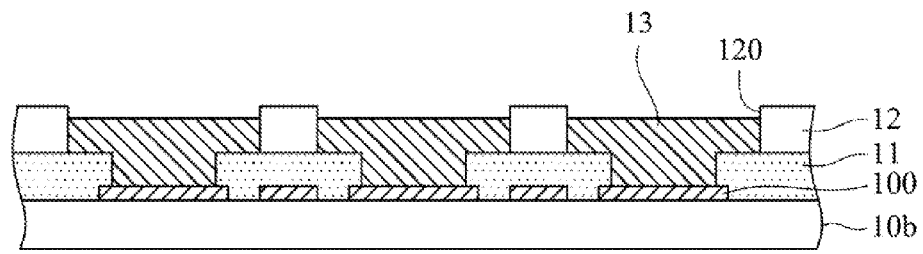
Figure 1D:
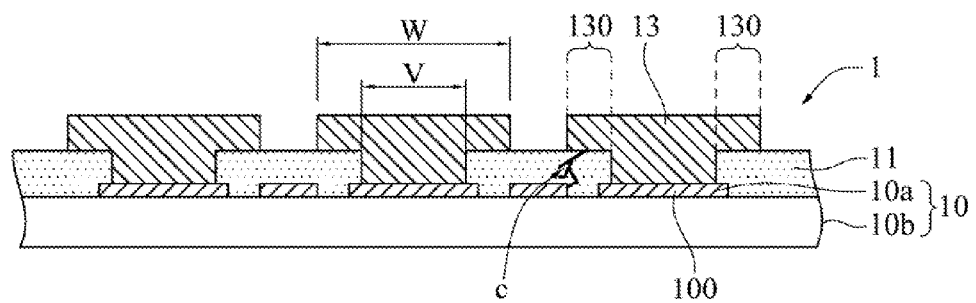
Figure 1E:
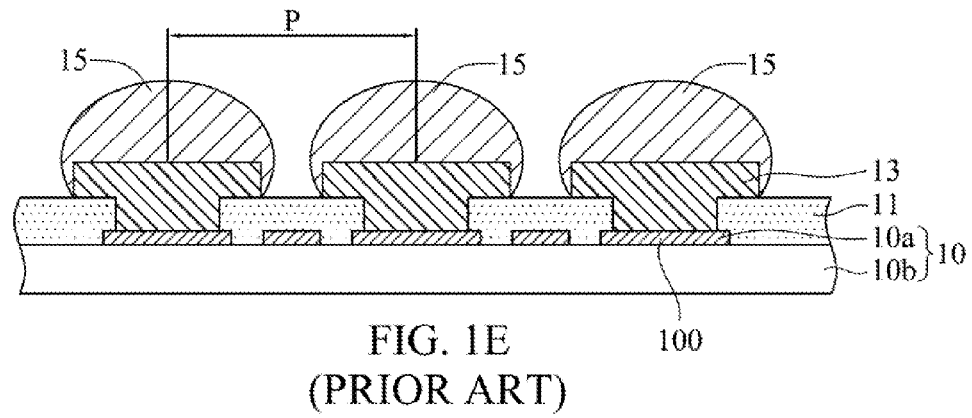

The present disclosure of the invention about a packaging substrate and a method for manufacturing the same are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

The singular forms "a," "an" and "the" used herein include plural referents unless the context clearly dictates otherwise. Therefore, reference to, for example, a metal layer includes embodiments having two or more such metal layers, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or ore embodiments. It should be appreciated that the following figures are not drawn to scale; rather, the figures are intended; rather, these figures are intended for illustration.

FIGS. 2A-2F' are schematic cross-sectional views at various stages of fabricating a packaging substrate according to the present disclosure.

Figure 2A:
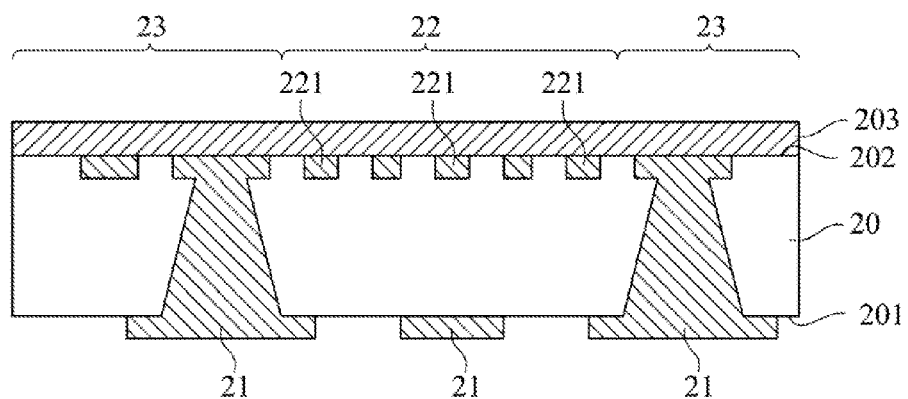
FIGS. 2A-2F' are schematic cross-sectional views at various stages of fabricating a packaging substrate according to the present disclosure.

As shown in FIG. 2A, a substrate body 20 is provided, which has a first surface 201, a second surface 202 opposite to the first surface 201 and a whole-sheeted metal layer 203 covering the second surface 202. The first surface 201 has a plurality of first conductive pads 21 thereon, and the second surface 202 has a die attach area 22 and a peripheral area 23 surrounding the die attach area 22. The die attach area 22 has a plurality of second conductive pads 221 embedded therein, wherein top surfaces of the second conductive pads 21 are exposed from the second surface 202, and the whole-sheeted metal layer 203 contacts the second conductive pads 221.

Figure 2B:
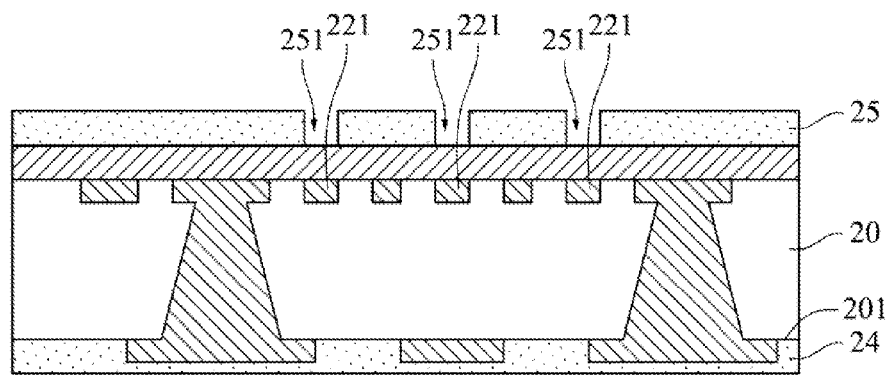
Figure 2C:
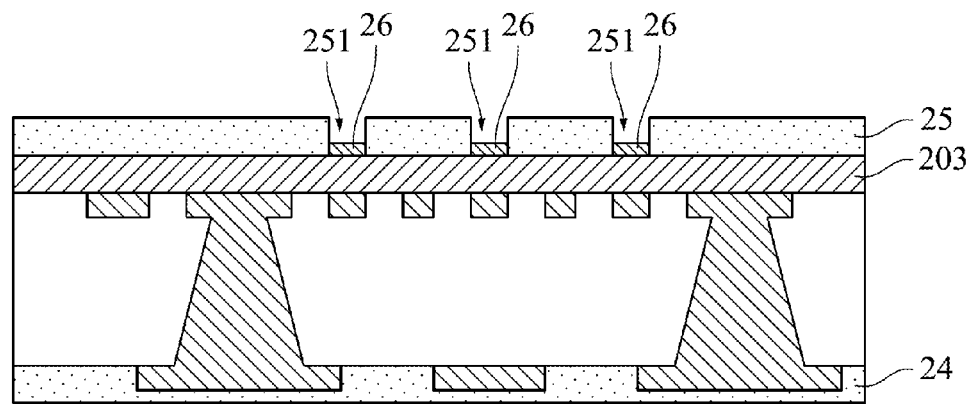
Figure 2D:
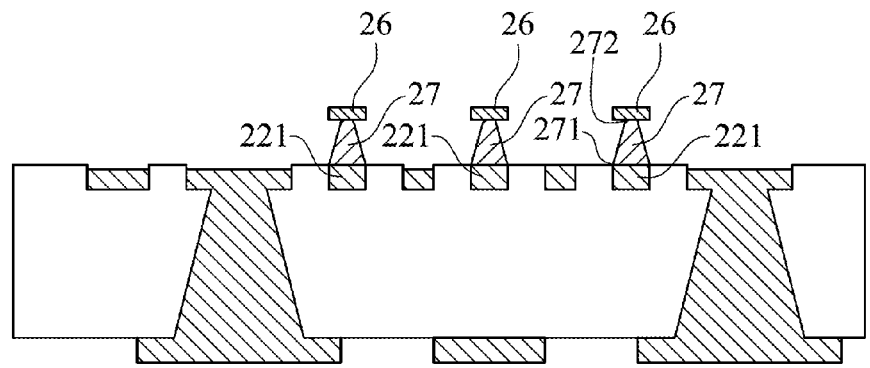

Referring to FIGS. 2B-2D, a photo-lithography and etching process is performed on the whole-sheeted metal layer to form a plurality of conductive pillars 27 correspondingly disposed on the second conductive pads 221.

FIG. 2B shows a subsequent process of FIG. 2A. A first photoresist layer 24 is formed on the first surface 201 of the substrate body 20 and a second photo-resist layer 25 on the whole-sheeted metal layer 203. The second photo-resist layer 25 has a plurality of openings 251 correspondingly aligned with the second conductive pads 221.

Subsequently, in FIG. 2C, a mask metal layer 26 is formed on the whole-sheeted metal layer 203 in the openings 251 of the second photo-resist layer 25.

In FIG. 2D, the first photo-resist layer 24 and second photo-resist layer 25 are removed, and the whole-sheeted metal layer 203 is etched to form the conductive pillars 27 correspondingly disposed on the second conductive pads 221. The conductive pillars 27 have first ends 271 and opposite second ends 272. The first ends 271 are closer than the second ends 272 from the second conductive pads 221, and the first ends 271 have a width bigger than a width of the second ends 272.

Figure 2E:
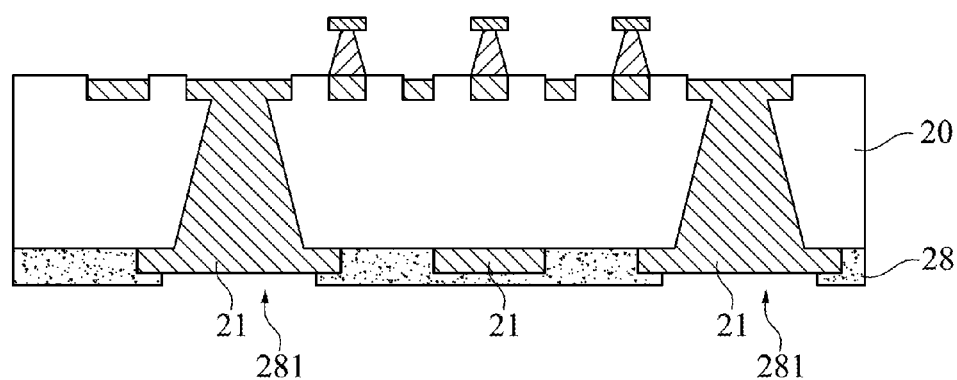
Figure 2E:
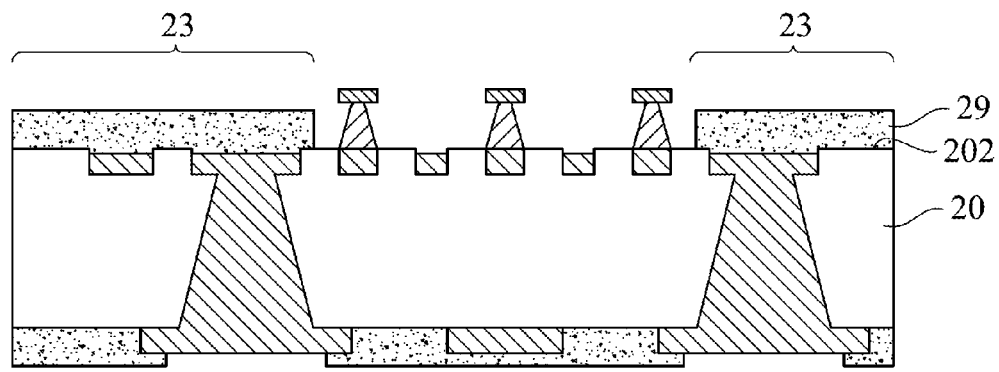

In an embodiment, a first insulating protective layer 28 is formed on the first surface 201 of the substrate body 20, the first insulating protective layer 28 has a plurality of openings 281 to correspondingly expose parts of the first conductive pads 21, as shown in FIG. 2E.

In an embodiment, a second insulating protective layer 29 is formed on the peripheral area 23 of the second surface 202 of the substrate body 20, as shown in FIG. 2E'.

Figure 2F:
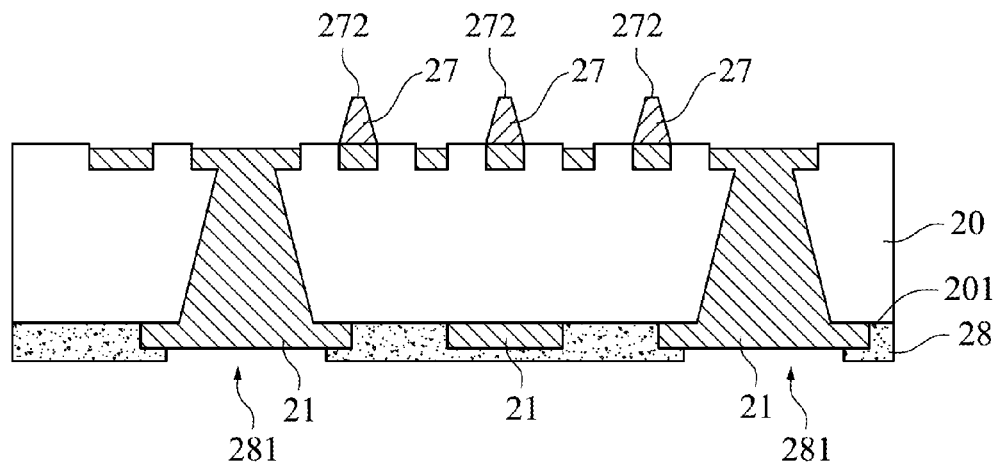
Figure 2F:
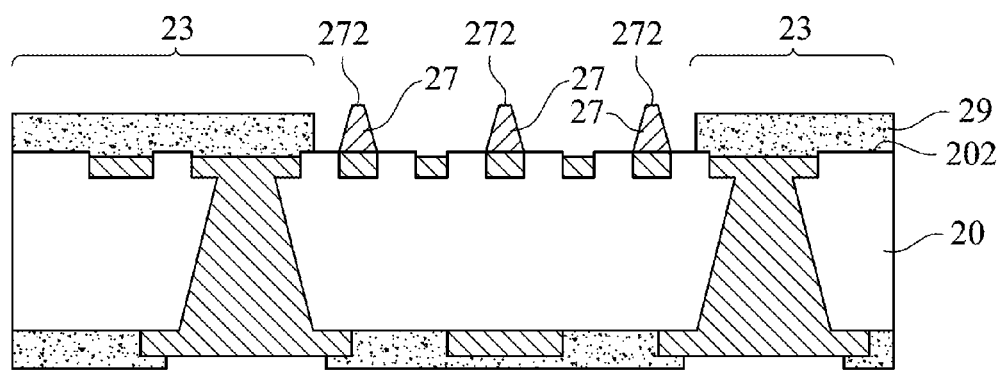

In an embodiment, the mask metal layer 26 in FIG. 2E may be removed to expose the second ends 272 of the conductive pillars 27, as shown in FIG. 2F.

In an embodiment, the mask metal layer 26 in FIG. 2E' may be removed to expose the second ends 272 of the conductive pillars 27, as shown in FIG. 2F'.

In FIG. 2F, the packaging substrate comprises a substrate body 20 and first conductive pillars 27. The substrate body 20 has a first surface 201 and a second surface 202 opposite to the first surface 201. The first surface 201 has a plurality of first conductive pads 21, and the second surface 202 has a die attach area 22 and a peripheral area 23 surrounding the die attach area 22. The die attach area 22 has a plurality of second conductive pads 221 embedded therein. The top surfaces of the second conductive pads 221 are exposed from the second surface 202, and the die attach area 22 of the second surface 202 is fully exposed.

The conductive pillars 27 are correspondingly disposed on the second conductive pads 221 and have first ends 271 and opposite second ends 272. The first ends 271 are closer than the second ends 272 from the second conductive pads 221, and the first ends 271 have a width bigger than a width of the second ends 272.

In FIG. 2F, a first insulating protective layer 28 covers the first surface 201 of the substrate body 20, and has a plurality of openings 281 correspondingly exposing parts of the first conductive pads 21

In FIG. 2F', the packaging substrate is different from the packaging substrate in FIG. 2F, which further comprises a second insulating protective layer 29 covering the peripheral area 23 of the second surface 202.

In FIG. 2E, the packaging substrate is different from the packaging substrate in FIG. 2F, which further comprises a plurality of solder layers 26 correspondingly disposed on the conductive pillars 27.

In FIG. 2E', the packaging substrate is different from the packaging substrate in FIG. 2E, which further comprises a second insulating protective layer 29 covering the peripheral area 23 of the second surface 202.

In summary, the packaging substrate according to the present disclosure utilizes that the width of the first end is bigger than the width of the second to form a structure without a wing structure to reduce the distance between contact points and satisfy the demands for fine-pitch and multi-joints.

Moreover, the first insulating protective layer covers the first surface of the substrate body, and the second surface of the substrate body is fully exposed, or covered by the second insulating protective layer on the peripheral area, while the die attach area thereof is fully exposed.

Furthermore, the second end of the first conductive pillars may be covered by a solder layer. The solder layer is also applied as a mask metal layer while the etching process of a whole-sheeted metal layer is performed.

Although embodiments of the present disclosure and their advantages have been described in detail, they are not used to limit the present disclosure. It should be understood that various changes, substitutions and alterations can be made herein without departing from the spirit and scope of the present disclosure. Therefore, the protecting scope of the present disclosure should be defined as the following claims.

What is claimed is:

1. A packaging substrate, comprising:
a substrate body having a first surface and a second surface opposite to the first surface, the first surface having a plurality of first conductive pads thereon, and the second surface having a die attach area and a peripheral area surrounding the die attach area, the die attach area having a plurality of second conductive pads embedded therein, wherein top surfaces of the second conductive pads are exposed from the second surface, and the die attach area of the second surface is fully exposed; and
a plurality of conductive pillars correspondingly disposed on the second conductive pads and having first ends and opposite second ends, wherein the first ends are level with the second surface of the substrate body, and the first ends have a width bigger than a width of the second ends.

2. The packaging substrate of claim 1, further comprising a first insulating protective layer covering the first surface of the substrate body and having a plurality of openings correspondingly exposing parts of the first conductive pads.

3. The packaging substrate of claim 2, further comprising a second insulating protective layer covering the peripheral area of the second surface.

4. The packaging substrate of claim 1, further comprising a plurality of solder layers correspondingly disposed on the conductive pillars.

5. A packaging substrate, comprising:
a substrate body having a first surface and a second surface opposite to the first surface;
a plurality of first conductive pads disposed on the first surface;
a plurality of second conductive pads embedded in and exposed on the second surface, wherein the second conductive pads define a die attach area and a peripheral area surrounding the die attach area; and
a plurality of conductive pillars correspondingly disposed on the second conductive pads, wherein each of the conductive pillar has a first end and a second end, the first end is in contact with the second conductive pad, the first end is level with the second surface of the substrate and the conductive pillar tapers from the first end toward the second end.

* * * * *